US009461631B1

(12) United States Patent
Oh et al.

(10) Patent No.: US 9,461,631 B1
(45) Date of Patent: Oct. 4, 2016

(54) CIRCUITRY AND METHODS FOR MEASURING AND CORRECTING DUTY-CYCLE DISTORTION

(71) Applicant: Altera Corporation, San Jose, CA (US)

(72) Inventors: Kyung Suk Oh, Cupertino, CA (US); Sean Shau-Tu Lu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/614,814

(22) Filed: Feb. 5, 2015

(51) Int. Cl.
*H03K 3/017* (2006.01)
*H03K 5/26* (2006.01)

(52) U.S. Cl.
CPC ............... *H03K 3/017* (2013.01); *H03K 5/26* (2013.01)

(58) Field of Classification Search
CPC .......... H03K 3/017; H03K 5/01; H03K 5/13; H03K 5/156; H03K 5/26; H03K 5/086; H03K 9/08; H03L 7/00; H03L 7/06; H03L 7/07; H03L 7/08; H03L 7/16; H03L 7/18; H03L 1/022

USPC ................. 327/172, 173, 174, 175
See application file for complete search history.

(56) References Cited

U.S. PATENT DOCUMENTS

2014/0253195 A1* 9/2014 Chandrasekaran .. H03K 5/1565
327/175

* cited by examiner

*Primary Examiner* — John Poos
(74) *Attorney, Agent, or Firm* — Fletcher Yoder, P.C.

(57) ABSTRACT

A method of measuring duty-cycle distortion in a signal (e.g., flowing between an operating circuit and a memory circuit), where the signal has a known period, the signal being measured is in a first state during a first portion of the period, and is in a different state during a second portion of the period, includes advancing or retarding the signal until an edge of the signal intersects an edge of the other signal. From the amount of the advancing or retarding, the duty cycle and the magnitude of duty-cycle distortion are determined. This may be used to control correction of the duty-cycle distortion. An interpolator circuit may be used to advance or retard the signal. A processor may be used to keep track of the amount of advancing or retarding, to determine the duration of the duty cycle, and control correction of the duty-cycle distortion.

18 Claims, 8 Drawing Sheets

CIRCUITRY AND METHODS FOR MEASURING AND CORRECTING DUTY-CYCLE DISTORTION

FIELD OF THE INVENTION

This invention relates to circuitry and methods for correcting duty-cycle distortion, particularly in systems that include double-data-rate, or higher data-rate, memory.

BACKGROUND OF THE INVENTION

In clocked systems, the clock period is fairly reliable. However, the division of the clock period between intervals of high signal duration and of low signal duration—i.e., the duty cycle—whether in a clock signal or a data signal, may be less reliable. For example, the JEDEC DDR4 memory standard allows for duty-cycle deviation of ±2% of the clock period. Anecdotal reports suggest, however, that in some systems duty-cycle distortion may be as much as ±10%. That would mean, for example, that in a clock signal that is supposed to be high during 50% of the clock period and low during the other 50% of the clock period, the actual signal may be high during 55% of the clock period and low during the other 45% of the clock period, or vice-versa.

This is of particular concern in double data-rate memory (or higher data-rate memories) in which data are read on both rising and falling edges of a clock or strobe signal, because duty-cycle distortion in the clock signal can lead to duty-cycle distortion in the data signal. And if data are read on both rising and falling edges of a clock or strobe signal, and the data signal is not alternating between low and high on time, one or both of the rising and falling clock edges may intersect the wrong data value.

Adjusting the duty cycle is relatively straightforward once the need for adjustment is recognized. However, determining the duty cycle, thereby to recognize when adjustment is needed, is less straightforward.

SUMMARY OF THE INVENTION

In accordance with embodiments of the present invention, the duty cycle of clock and data signals may be measured, so that it can be adjusted if needed, by advancing or retarding the signal whose duty cycle is to be measured until an edge of that signal—clock or data—coincides with a corresponding edge of the other signal—data or clock, respectively. The signal to be measured may then be retarded or advanced until another edge coincides with a corresponding other edge of the other signal. The total amount of advancement and retardation, plus the interval between the edges, add up to the known period, and therefore the amount of advancement and retardation can be used to determine the degree of duty-cycle distortion, as described in more detail below.

Therefore, in accordance with an embodiment of the present invention there is provided a method of measuring duty-cycle distortion in one of a clock or data signal (e.g., flowing between an operating circuit and a memory circuit), where the clock signal and the data signal have a known period, the one of the data signal and the clock signal is in a first state during a first portion of the known period, and is in a second state, different from the first state, during a second portion of the known period. The method includes advancing or retarding the one of the clock or data signal until an edge of the one of the clock or data signal intersects an edge of another of the clock or data signal, and keeping track of an amount of said advancing or retarding until the edge of the one of the clock or data signal intersects an edge of another of the clock or data signal. From the amount of the advancing or retarding, a duration of a portion of the one of the clock or data signal is derived. A duty cycle of the one of the clock or data signal is determined from the duration. In a method of correcting duty-cycle distortion in one of a clock or data signal flowing between an operating circuit and a memory circuit, the measured magnitude is used to control correction of the duty-cycle distortion of the one of the clock signal or the data signal.

In accordance with another embodiment of the present invention there is provided apparatus for measuring duty-cycle distortion in one of a clock or data signal (e.g., flowing between an operating circuit and a memory circuit), where the clock signal and the data signal have a known period, the one of the data signal and the clock signal is in a first state during a first portion of the known period, and is in a second state, different from the first state, during a second portion of the known period. The circuitry includes an interpolator circuit that advances or retards the one of the clock or data signal until an edge of the one of the clock or data signal intersects an edge of another of the clock or data signal. The circuitry also includes a processor that keeps track of an amount of the advancing or retarding until the edge of the one of the clock or data signal intersects an edge of another of the clock or data signal, derives from the amount of the advancing or retarding a duration of a portion of the one of the clock or data signal, and determines from the duration a duty cycle of the one of the clock or data signal. The processor may use the measured magnitude of duty-cycle distortion to control correction of the duty-cycle distortion.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

As noted above, even where the duty cycle of a signal is distorted, the overall period of the signal is generally reliable. In addition, duty-cycle distortion when a device first starts up is generally on the order of ±10% or less. Therefore, duty-cycle distortion can be measured, and therefore corrected, as described below.

Given a clock signal and a data signal with a known period, the data signal can be used to correct the clock signal or vice-versa. Moreover, once one of the clock or data signals has been corrected, the corrected signal can be used to correct the other signal. As described below, duty-cycle distortion of a clock signal will be measured using a data signal. However, it should be understood that one also can measure duty-cycle distortion of a data signal using a clock signal.

Generally, in an implementation of the process according to embodiments of the invention, a known data signal such as an alternating high-low "tone" signal, which is nominally high for one half of its period and low for the other half of its period, will be transmitted. The clock signal whose duty-cycle distortion is to be measured similarly is nominally high for one half of its period and low for the other half of its period, although the halves may not correspond (i.e., one signal may be high when the other is low) and the edges of the two signals may not be—and probably will not be—aligned.

In the most general case, where the edges of the clock signal being measured and the data signal against which the clock signal is being measured are not aligned, the period of the data signal can be broken up into three temporal regions. In a first and third of those temporal regions, the clock signal will have one value (high or low), and in a second temporal region, which occurs between the first and third temporal regions, the clock signal will have the opposite value (low or high). In a case where an edge of the clock signal happens to align with an edge of the data signal, there may be only two regions, but in the general case there will be three regions.

The ratio of the duration of the high region(s)—e.g., the second region when the second region is high—to the period is the duty cycle. However, the duration of the second region cannot be measured directly, because of the distortion. But the sum of the durations of the three regions equals the period, which is known.

Therefore, if the durations of the first and third regions can be measured, the duration of the second region can be computed by subtracting the sum of the durations of the first and third regions from the period. Once the duration of the second region is known, it can be adjusted using known techniques (e.g., by adjusting drive strength) to achieve the desired duty cycle (typically 50%).

Figure 1:
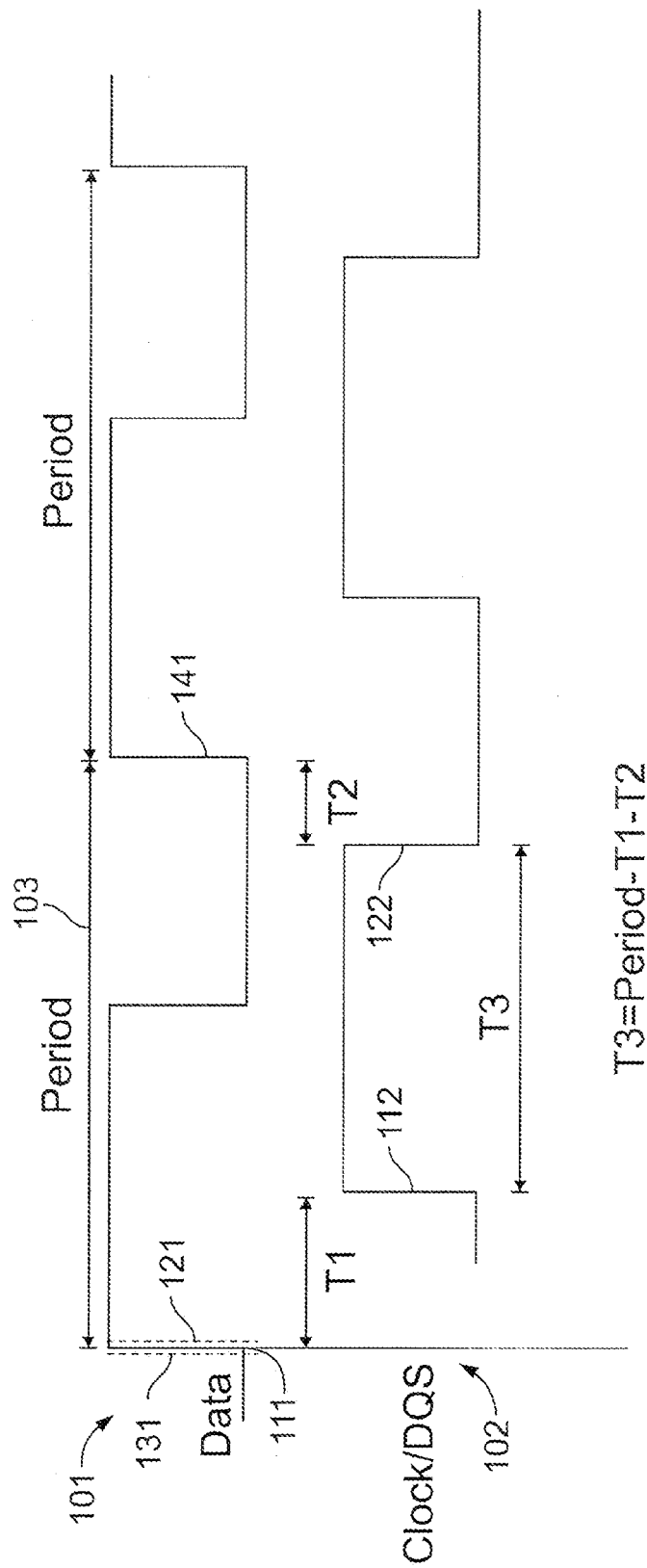
FIG. 1 shows a data signal and a data strobe signal or clock signal which may be measured and/or corrected according to a first variant of an embodiment of the invention.

FIG. 1 shows a data signal 101 and a data strobe (DQS) signal or clock signal 102 having the same period 103. Each of data signal 101 and clock signal 102 nominally has a 50% duty cycle. However, as drawn, as can be seen, both signals suffer from duty-cycle distortion. In a first example, data signal 101 is used to correct the duty cycle of clock signal 102.

In this example, first clock signal 102 is advanced until rising edge 112 of clock signal 102 coincides with rising edge 111 of data signal 101. Clock signal 102 may be generated by a source, such as a phase-locked loop (PLL), that provides a plurality of clock phases or steps (e.g., 8, 64, 128 or 256 phases). Clock signal 102 may be advanced one phase at a time until rising edge 112 coincides with rising edge 111. The coincidence of rising edge 112 with rising edge 111 may be determined by detecting that the value of data signal 101 at the current phase of rising edge 112 has changed from the value of data signal 101 at the previous phase of rising edge 112. The value of data signal 101 as measured at the rising edge may be indeterminate, but the value of data signal 101 at the phase 121 subsequent to the rising edge will be definitively different from the value of data signal 101 at the phase 131 prior to the rising edge, so the phase between phase 121 and phase 131 can be established to be the correct phase. Clock signal 102 may be advanced one phase step at a time, and the number of phase steps by which clock signal 102 is advanced until coincidence of rising edge 112 with rising edge 111 may be stored as duration T1 of FIG. 1.

Similarly, clock signal 102 may be returned to its original phase and then retarded one phase step at a time until falling edge 122 coincides with rising edge 141. The number of phase steps by which clock signal 102 is retarded until coincidence of falling edge 122 with rising edge 141 may be stored as duration T2 of FIG. 1.

Durations T1 and T2 may be subtracted from the known period to yield duration T3 of FIG. 1 (the high portion of clock signal 102). Once duration T3 is known, it may be adjusted using known circuitry and techniques, as described above and further described below, until it reflects the desired duty cycle (e.g., 50%).

Figure 2:
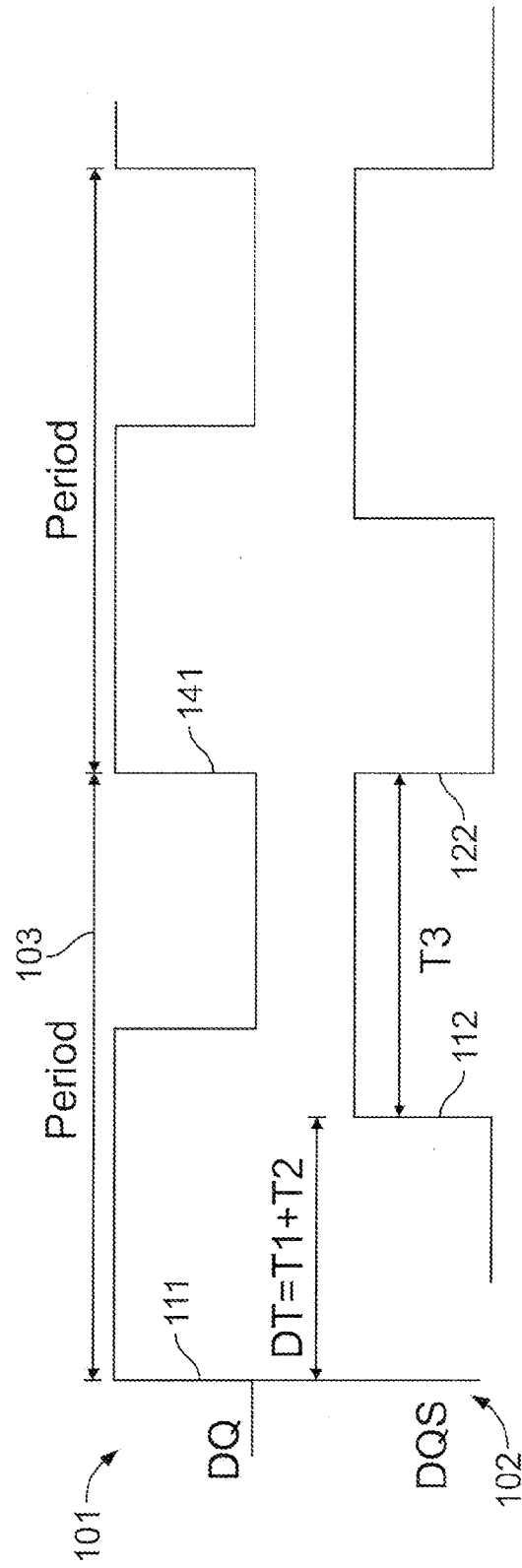
FIG. 2 shows a data signal and a data strobe signal or clock signal which may be measured and/or corrected according to a second variant of that embodiment of the invention.

In a variant shown in FIG. 2, clock signal 102 is retarded until falling edge 122 coincides with rising edge 141, but to save memory the corresponding duration T2 is not stored. Rather, the retarded signal is then advanced until rising edge 112 coincides with rising edge 111. The total number of phase steps by which retarded clock signal 102 is advanced, until coincidence of rising edge 112 with rising edge 111, may be stored as duration DT (DT=T1+T2) of FIG. 2. Duration DT may be subtracted from the known period to yield duration T3 of FIG. 2 (the high portion of clock signal 102). Once duration T3 is known, it may be adjusted using known circuitry and techniques, as described above, until it reflects the desired duty cycle (e.g., 50%).

Figure 3:
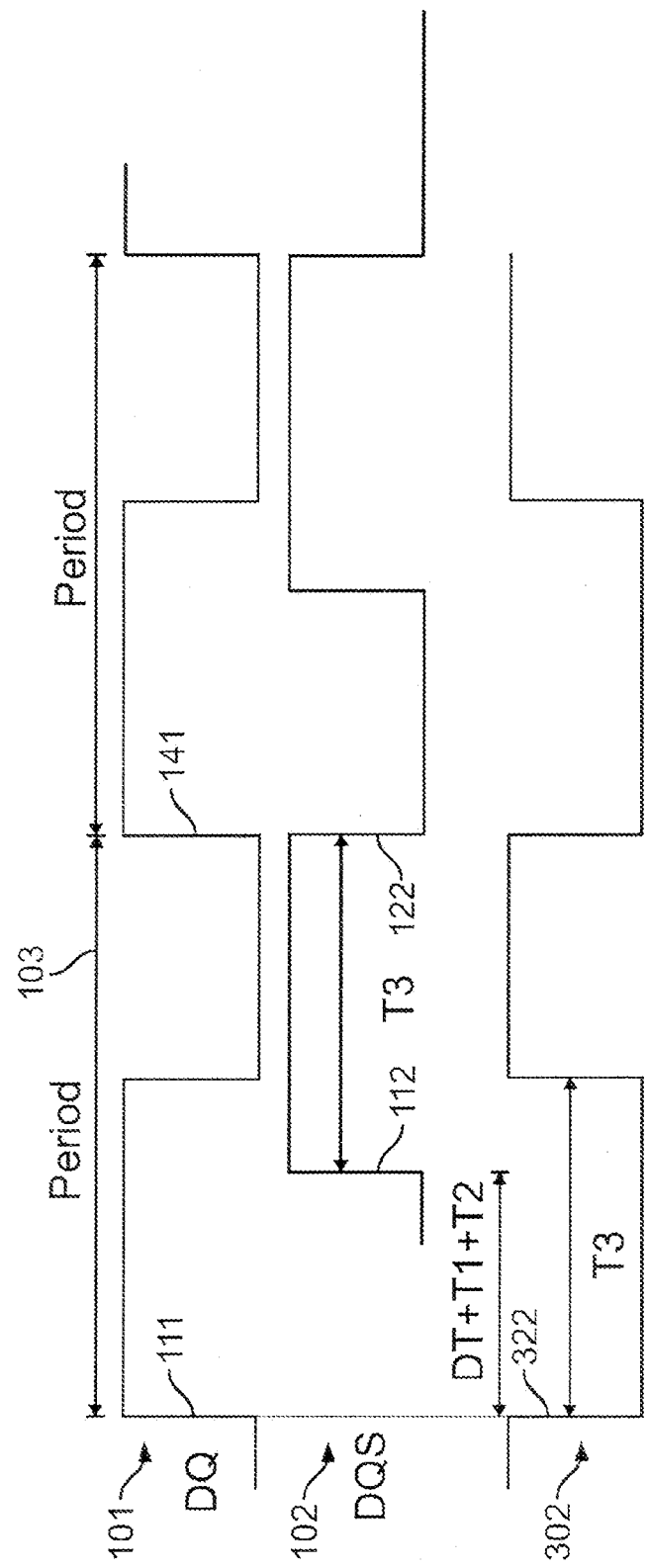
FIG. 3 shows a data signal and a data strobe signal or clock signal which may be measured and/or corrected according to a third variant of that embodiment of the invention.

The variants shown in FIGS. 1 and 2 depend on detecting a rising data edge on both a rising clock edge and a falling clock edge, which means having two different types of detectors. The variant shown in FIG. 3 operates by detecting rising data edges only on falling clock edges, which means that one type of detector is sufficient. In the variant of FIG. 3, clock signal 102 is retarded until falling edge 122 coincides with rising edge 141 as in FIG. 2. If clock signal 102 were then advanced as in FIG. 2, a detector that detects a rising data edge on a rising clock edge would be needed. In order to continue using the detector that detects a rising data edge on a falling clock edge, retarded clock signal 102 is inverted, as at 302 (many devices have clock circuitry that allows clock inversion). Inverted retarded clock signal 302 is then advanced until falling edge 322 (inverted rising edge 112) coincides with rising edge 111. (As drawn in FIG. 3, inverted retarded clock signal 302 is shown as this coincidence occurs, after signal 302 has been advanced.) The total number of phase steps by which inverted retarded clock signal 302 is advanced, until coincidence of falling edge 322 with rising edge 111, may be stored as duration DT. As in FIG. 2, duration DT may be subtracted from the known period to yield duration T3, and once duration T3 is known, it may be adjusted using known circuitry and techniques, as described above, until it reflects the desired duty cycle (e.g., 50%).

Figure 4:
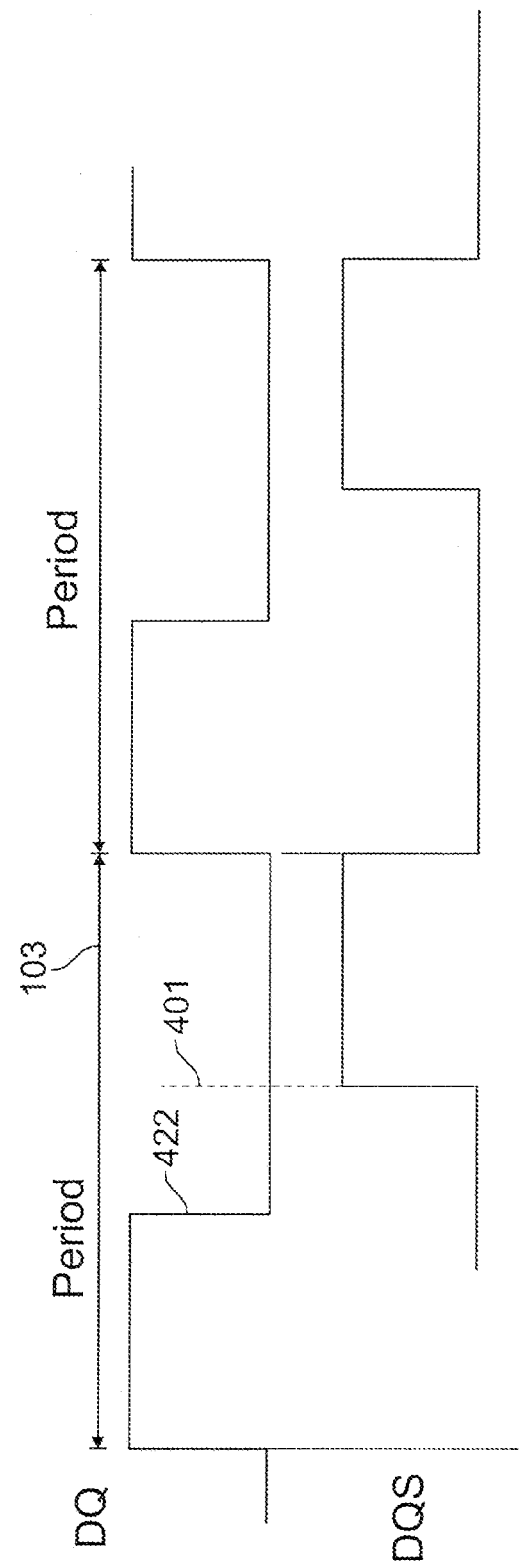
FIG. 4 shows a data signal and a data strobe signal or clock signal which may be measured and/or corrected according to a fourth variant of that embodiment of the invention.

In each of FIGS. 1 and 2, intersection of the rising clock edge with a rising data edge as clock signal 102 is advanced is detected when data signal 101, which had been high, becomes low. The same is true of the intersection of the falling clock edge with a rising data edge in FIG. 3 as clock signal 302 is advanced. That assumes that the data signal duty cycle is such that the rising edge of clock 102 or the falling edge of clock 302 intersect a high data signal when advancing of clock signal 102/302 begins. But if the data signal duty cycle is such that the data signal is low at that point, as in FIG. 4, the detector may falsely indicate that the edge of clock 102/302 has passed the rising data edge.

To avoid such a false positive indication, a data-high flag, which is initialized to OFF (low) may be used. The circuitry may be designed so that intersection of the relevant advancing clock edge with a low data signal will not indicate that a rising edge has been encountered until a high data signal has first been encountered. Once a high data signal is encountered, the high-data flag would be set, and only when the high-data flag is set will a low data signal be considered an indication that the rising data edge has been encountered. Thus, in the scenario depicted in FIG. 4, the high-data flag would remain OFF (low) until the rising/falling edge of clock signal 102/302 (e.g., edge 401) passes falling data edge 422, when the high-data flag would turn ON (high). Only if the high-data flag is ON (high) would detection of a low data signal be considered an indication that the rising data edge has been encountered. In the scenarios of FIGS. 1-3, detection of a low data signal also would be considered an indication that the rising data edge has been encountered only if the high-data flag is ON, but the high-data flag would turn ON immediately in those scenarios because data signal 101 is already high when advancing of clock signal 102/302 begins. It will be appreciated that a low-data flag also may be used to prevent false detection of a rising data edge while clock signal 102/302 is being retarded.

As noted above, once the duty cycle of clock signal 102 is adjusted, the clock signal may be used to correct the duty cycle of data signal 101 in the same manner. While this may appear to be circular, if performed soon after the device starts up, the duty cycles will be close enough to their nominal values that such a bootstrapping use of the calibration procedure will provide accurate results.

Figure 5:
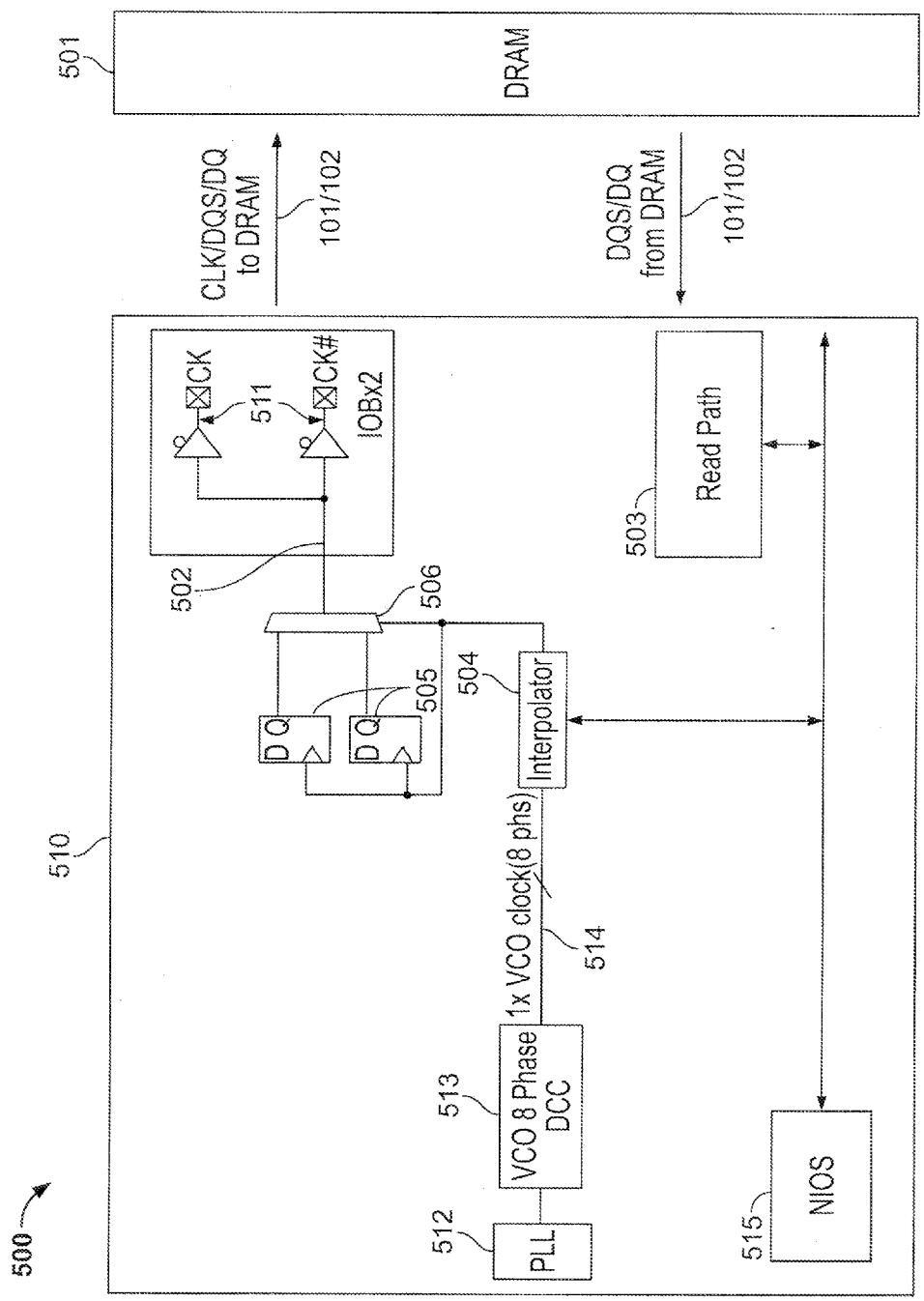
FIG. 5 shows an implementation of circuitry according to an embodiment of the invention.

One possible implementation of circuitry 500 for performing the foregoing method is shown in FIG. 5. Clock or data strobe signal 102, as well as data signal 101, are output to DRAM 501 via write path 502, while the return data and data strobe signals 101, 102 are returned from DRAM 501 via read path 503. In one implementation, circuitry 500 is implemented on an FPGA 510, although a fixed circuit implementation also may be used. Write path 502 may include two input/output blocks 511 of FPGA 510, while read path 503 includes one input/output block 511 (not shown).

A phased-locked loop (PLL) 512 provides a multi-phase (e.g., eight-phase) clock signal 514, which is output to write path 502 via interpolator 504 and flip-flops 505, through multiplexer 506 in a conventional manner. Interpolator 504 will advance or retard the clock or data signal (depending on which signal is being corrected) under control, e.g., of processor 515. Processor 515 may be a dedicated microprocessor circuit or, in an FPGA implementation, may be an instantiation on the FPGA of a "soft" processor configured from configurable logic resources of the FPGA (e.g., the processor core available from Altera Corporation, of San Jose, Calif., under the trademark NIOS®).

Processor 515 may include one or more instances of a comparator in circuitry or logic to detect when rising and/or falling edges intersect. Such a comparator may be used to detect a rising or falling edge of a signal by comparing that signal to a high or low threshold. If the signal is being advanced, a change from HIGH to LOW will indicate a rising edge and a change from LOW to HIGH will indicate a falling edge. Similarly, if a signal is being retarded, a change from HIGH to LOW will indicate a falling edge and a change from LOW to HIGH will indicate a rising edge. Such a comparator also may be used to set the high-data flag and low-data flag discussed above.

Processor 515 controls the sweeping of the clock or data signals via write path 502 and also reads the back the sweeping results via read path 503. The read-back results are used by processor 515 to control interpolator 504 to adjust the sweeping and also to correct the duty cycle.

Figure 6:
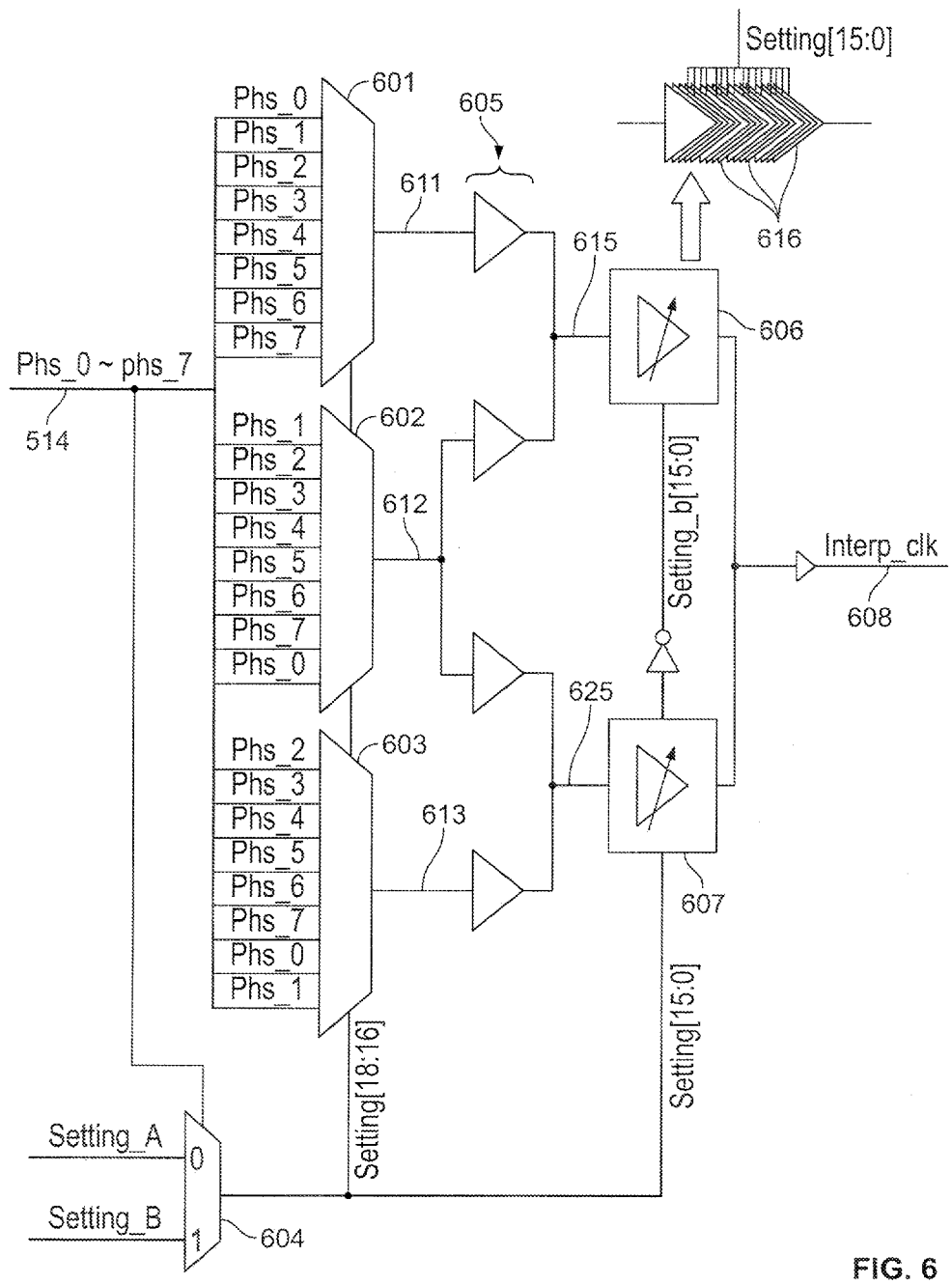
FIG. 6 shows a more detailed implementation of a portion of the circuitry of FIG. 5.

The details of one implementation of interpolator 504 are shown in FIG. 6. The eight clock phases 514 from PLL 512 are selected, in different orders, by multiplexers 601, 602, 603, based on the output of multiplexer 604 which is controlled by phase 0 of clock 514. The three phases 611, 612, 613 are combined at 605 into two average phases 615, 625, which are output through interpolator circuits 606, 607 to provide interpolated clock 608.

Each of interpolator circuits 606, 607 may be implemented, for example, as sixteen tristate buffers 616. The number of tristate buffers that are enabled (e.g., based on the output of multiplexer 604) determines the driving strength. With each of the eight phases divisible into sixteen steps, the clock can be delayed in steps of duration $T/(16\times 8)=T/128$, where T is the clock period.

The phase averaging described above provides a more uniform step size. For example, if the clock rate is 1 GHz, then nominally T=1 ns, making each phase 125 ps, and each step 125/16 ps≈7.81 ps. However, in reality the phases are not uniform. Thus, the first three phases may have durations of 100 ps, 150 ps and 125 ps, with step sizes of about 6.25 ps, 9.375 ps and 7.81 ps. By averaging the phases, we get two phases with durations of about 125 ps and about 137.5 ps, with step sizes of about 7.81 ps and 8.59 ps, which are more uniform.

The duty cycle may be controlled by the inputs A and B to multiplexer 604. If A=B, the duty cycle should nominally be 50%. If the duty cycle is distorted, then it may be increased by making B>A, or decreased by making A>B.

DRAM 501 normally would not be on the same die as circuitry 510 (whether fixed circuitry or an FPGA), because double data-rate (or higher data-rate) operation is not needed on the same die. DRAM 501 and circuitry 510 could be part of a two-die (or multiple-die) system-on-chip (SoC) or could be separate dice in a single package connected by wirebonds, or could be separate chips on a single circuit board connected by circuit board traces, or separate devices connected by a cable.

Figure 7:
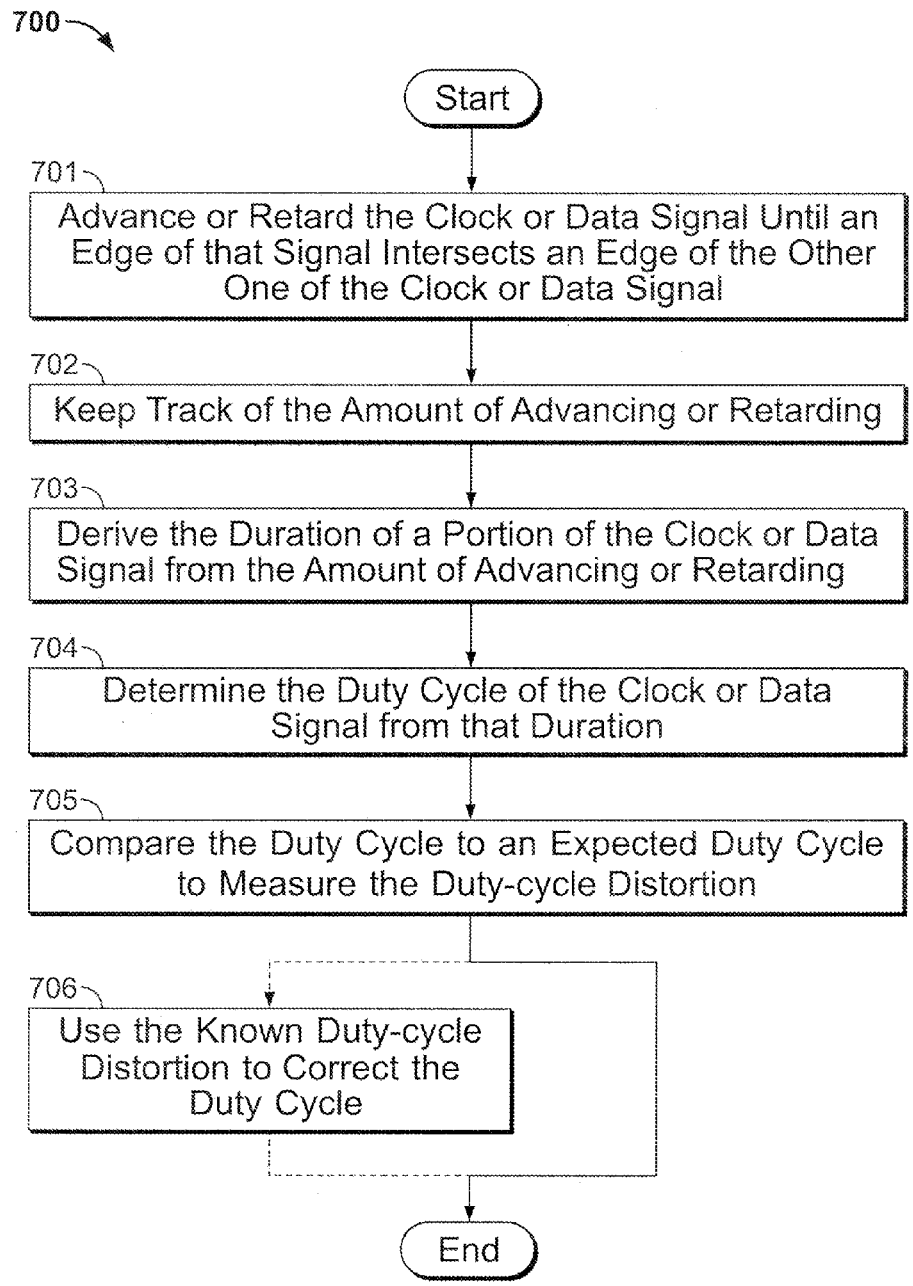
FIG. 7 is a flow diagram of a method according to an embodiment of the present invention for measuring and/or correcting duty-cycle distortion.

A method according to an embodiment 700 of the invention is diagrammed in FIG. 7. At 701, either the clock signal or the data signal is advanced or retarded until an edge of the clock or data signal intersects an edge of the other one of the clock or data signal. At 702, the amount of advancing or retarding until the edges intersect is kept track of. At 703, the duration of a portion of the clock or data signal is derived from the amount of advancing or retarding. At 704, the duty cycle of the clock or data signal is determined from that duration. At 705, the duty cycle is compared to an expected duty cycle to measure the duty-cycle distortion. Optionally, at 706, the known duty-cycle distortion is used to correct the duty cycle.

Thus it is seen that a system and method for detecting duty-cycle distortion, and thereby correcting that distortion, have been provided.

Figure 8:
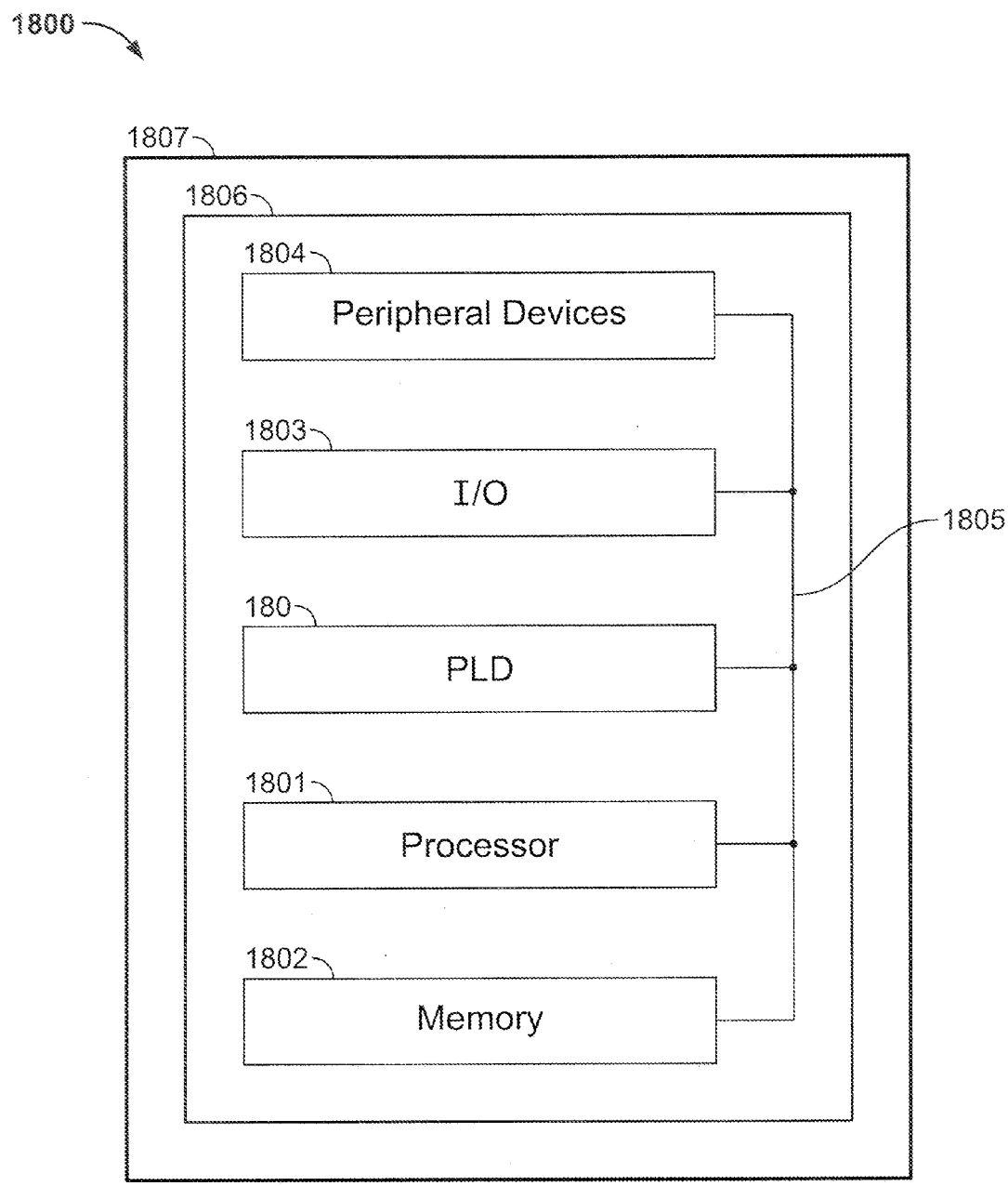
FIG. 8 shows a simplified block diagram of an exemplary system employing a programmable logic device incorporating the present invention.

An FPGA or other PLD 180 configured to include duty-cycle distortion correction circuitry according to an implementation of the present invention, whether or not including additional circuitry, may be used in many kinds of electronic devices. One possible use is in an exemplary data processing system 1800 shown in FIG. 8. Data processing system 1800 may include one or more of the following components: a processor 1801; memory 1802; I/O circuitry 1803; and peripheral devices 1804. These components are coupled together by a system bus 1805 and are populated on a circuit board 1806 which is contained in an end-user system 1807.

System 1800 can be used in a wide variety of applications, such as computer networking, data networking, instrumentation, video processing, digital signal processing, Remote Radio Head (RRH), or any other application where the advantage of using programmable or reprogrammable logic is desirable. PLD 180 can be used to perform a variety of different logic functions. For example, PLD 180 can be configured as a processor or controller that works in cooperation with processor 1801. PLD 180 may also be used as an arbiter for arbitrating access to a shared resources in system 1800. In yet another example, PLD 180 can be configured as an interface between processor 1801 and one of the other components in system 1800. It should be noted that system 1800 is only exemplary, and that the true scope and spirit of the invention should be indicated by the following claims.

Various technologies can be used to implement PLDs 180 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of measuring duty-cycle distortion in one of a clock or data signal, wherein:
    said clock signal and said data signal have a known period;
    said one of said data signal and said clock signal is in a first state during a first portion of said known period, and is in a second state, different from said first state, during a second portion of said known period, wherein said first state is HIGH and said second state is LOW;
    said method comprising:
        advancing or retarding said one of said clock or data signal until an edge of said one of said clock or data signal intersects an edge of another of said clock or data signal, and keeping track of an amount of said advancing or retarding until said edge of said one of said clock or data signal intersects an edge of another of said clock or data signal, wherein said advancing or retarding said one of said clock or data signal until an edge of said one of said clock or data signal intersects an edge of another of said clock or data signal comprises advancing or retarding said one of said clock or data signal until an edge of said portion of said one of said clock or data signal in said first state or said second state intersects a rising edge or a falling edge of said another of said clock or data signal;
        deriving from said amount of said advancing or retarding a duration of a portion of said one of said clock or data signal;
        determining from said duration a duty cycle of said one of said clock or data signal; and
        comparing said duration of a duty cycle to an expected duty cycle.

2. The method of claim 1 wherein:
    no edge of said first portion of said one of said data signal or said clock signal in said first state coincides with an edge of said another of said data signal or said clock signal;
    said advancing or retarding comprises:
        advancing said one of said data signal or said clock signal until an edge of said first portion intersects a rising edge of said another of said data signal or said clock signal, and keeping track of an amount of said advancing, and
        retarding said one of said data signal or said clock signal until a different edge of said first portion intersects a rising edge of said another of said data signal or said clock signal and keeping track of an amount of said retarding; and
    said deriving said duration comprises adding said amounts of said advancing and retarding.

3. The method of claim 2 wherein:
    detection of a rising edge of said another of said data signal or said clock signal occurs only on one of a rising edge or a falling edge of said one of said data signal or said clock signal; and
    said method further comprises, after said advancing and prior to said retarding, inverting said another of said data signal or said clock signal.

4. The method of claim 1 wherein:
    detection of a rising edge of said another of said data signal or said clock signal is performed during said advancing by monitoring said another of said data signal or said clock signal until said another of said data signal or said clock signal changes state from HIGH to LOW; and
    detection of a rising edge of said another of said data signal or said clock signal is performed during said retarding by monitoring said another of said data signal or said clock signal until said another of said data signal or said clock signal changes state from LOW to HIGH.

5. The method of claim 4 wherein:
    detection of a rising edge of said another of said data signal or said clock signal during said advancing further comprises, prior to said monitoring said another of said data signal or said clock signal until said another of said data signal or said clock signal changes state from HIGH to LOW, setting a high-state flag when a HIGH state of said another of said data signal or said clock signal is detected, and not beginning, before said high-state flag is set, said monitoring said another of said data signal or said clock signal until said another of said data signal or said clock signal changes state from HIGH to LOW; and
    detection of a rising edge of said another of said data signal or said clock signal during said retarding further comprises, prior to said monitoring said another of said data signal or said clock signal until said another of said data signal or said clock signal changes state from LOW to HIGH, setting a low-state flag when a LOW state of said another of said data signal or said clock signal is detected, and not beginning, before said low-state flag is set, said monitoring said another of said data signal or said clock signal until said another of said data signal or said clock signal changes state from LOW to HIGH.

6. The method of claim 1 wherein said advancing and retarding is performed in fixed steps.

7. The method of claim 6 wherein said fixed steps are characteristic of a source of said clock signal.

8. A method of correcting duty-cycle distortion in one of a clock or data signal, said method comprising:
   measuring magnitude of said duty-cycle distortion of one of said clock signal or said data signal in accordance with the method of claim 1; and
   using said measured magnitude to control correction of said duty-cycle distortion of said one of said clock signal or said data signal.

9. The method of claim 8 further comprising, after said using, repeating said advancing or retarding, said deriving, and said determining, to measure duty-cycle distortion of another of said clock signal or said data signal.

10. The method of claim 9 further comprising repeating said using to control correction of said another of said clock signal or said data signal.

11. Apparatus for measuring duty-cycle distortion in one of a clock or data signal, wherein:
   said clock signal and said data signal have a known period;
   said one of said data signal and said clock signal is in a first state during a first portion of said known period, and is in a second state, different from said first state, during a second portion of said known period, wherein said first state is HIGH and said second state is LOW;
   said circuitry comprising:
   an interpolator circuit that advances or retards said one of said clock or data signal until an edge of said one of said clock or data signal in said first state or said second state intersects an edge of another of said clock or data signal; and
   a processor that:
      keeps track of an amount of said advancing or retarding until said edge of said one of said clock or data signal intersects an edge of another of said clock or data signal,
      derives from said amount of said advancing or retarding a duration of a portion of said one of said clock or data signal,
      determines from said duration a duty cycle of said one of said clock or data signal, and
      compares said duty cycle to an expected duty cycle.

12. The apparatus of claim 11 wherein:
   no edge of said first portion of said one of said data signal or said clock signal in said first state coincides with an edge of said another of said data signal or said clock signal;
   said interpolator advances said one of said data signal or said clock signal until an edge of said first portion intersects a rising edge of said another of said data signal or said clock signal;
   said interpolator retards said one of said data signal or said clock signal until a different edge of said first portion intersects a rising edge of said another of said data signal or said clock signal; and
   said processor keeps track of an amount of said advancing and of an amount of said retarding, and derives said duration by adding said amounts of said advancing and retarding.

13. The apparatus of claim 12 wherein:
   detection of a rising edge of said another of said data signal or said clock signal occurs only on one of a rising edge or a falling edge of said one of said data signal or said clock signal; and
   said apparatus further comprises circuitry that, after said advancing by said interpolator and prior to said retarding by said interpolator, inverts said another of said data signal or said clock signal.

14. The apparatus of claim 11 further comprising:
   a first comparator that detects a rising edge of said another of said data signal or said clock signal during said advancing by comparing said another of said data signal or said clock signal to a low threshold until said another of said data signal or said clock signal changes state from HIGH to LOW; and
   a second comparator that detects a rising edge of said another of said data signal or said clock signal during said retarding by comparing said another of said data signal or said clock signal to a high threshold until said another of said data signal or said clock signal changes state from LOW to HIGH.

15. The apparatus of claim 14 further comprising a high-state flag circuit and a low-state flag circuit, wherein:
   detection of a rising edge of said another of said data signal or said clock signal during said advancing further comprises setting said high-state flag circuit when a HIGH state of said another of said data signal or said clock signal is first detected;
   said first comparator does not detect said rising edge of said one of said data signal or said clock signal unless said high-state flag circuit is set;
   detection of a rising edge of said another of said data signal or said clock signal during said retarding further comprises setting said low-state flag when a LOW state of said another of said data signal or said clock signal is first detected; and
   said second comparator does not detect said rising edge of said another of said data signal or said clock signal unless said low-state flag is set.

16. The apparatus of claim 11 wherein said interpolator advances or retards said one of said clock or data signal in fixed steps.

17. The apparatus of claim 16 further comprising a phase-locked loop that supplies said clock signal, wherein said fixed steps are characteristic of said phase-locked loop.

18. The apparatus of claim 11 wherein said processor uses measured magnitude of duty-cycle distortion to control correction of said duty-cycle distortion.

* * * * *